United States Patent
Kobayashi et al.

(10) Patent No.: US 8,610,017 B2
(45) Date of Patent: Dec. 17, 2013

(54) CAPACITIVE INPUT SWITCH

(75) Inventors: Yusuke Kobayashi, Saitama (JP); Shoji Yamazaki, Saitama (JP); Sumitaka Araki, Saitama (JP); Atsuko Tanaka, Saitama (JP); Hiroto Komatsu, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 169 days.

(21) Appl. No.: 13/147,349

(22) PCT Filed: Feb. 4, 2010

(86) PCT No.: PCT/JP2010/051619
§ 371 (c)(1),
(2), (4) Date: Sep. 22, 2011

(87) PCT Pub. No.: WO2010/090263
PCT Pub. Date: Aug. 12, 2010

(65) Prior Publication Data
US 2012/0024685 A1    Feb. 2, 2012

(30) Foreign Application Priority Data
Feb. 4, 2009   (JP) ................. 2009-023551

(51) Int. Cl.
*H03K 17/975*   (2006.01)
(52) U.S. Cl.
USPC ........................................................ 200/600
(58) Field of Classification Search
USPC ........................................................ 200/600
See application file for complete search history.

(56) References Cited

FOREIGN PATENT DOCUMENTS

| | | | |
|---|---|---|---|
| JP | 48-40612 | Y1 | 11/1973 |
| JP | 63-299242 | A | 12/1988 |
| JP | 5-026753 | A | 2/1993 |
| JP | 6-111695 | A | 4/1994 |
| JP | 7-099346 | A | 4/1995 |
| JP | 2005-045022 | A | 2/2005 |
| JP | 2006-208573 | A | 8/2006 |
| JP | 2006-318735 | A | 11/2006 |
| WO | 03/036247 | A1 | 5/2003 |

OTHER PUBLICATIONS

International Search Report issued in PCT/JP2010/051619, mailed on Apr. 20, 2010, 2 pages.
Written Opinion issued in PCT/JP2010/051619, mailed on Apr. 20, 2010, 6 pages.
International Preliminary Report on Patentability issued in PCT/JP2010/051619, issued Sep. 13, 2011, 7 pages.

*Primary Examiner* — Xuong Chung Trans
(74) *Attorney, Agent, or Firm* — Osha Liang LLP

(57) ABSTRACT

In a capacitive input switch that is accommodated in a housing of electronic equipment, the capacitive input switch includes a rigidity imparting layer having rigidity and a laminate sheet laminated on the rigidity imparting layer. The rigidity imparting layer and the laminate sheet are three dimensionally formed. The laminate sheet is formed by a substrate sheet, a conductive pattern layer for capacitor formation, and a decorative layer that is laminated at least on any one of the substrate sheet and the conductive pattern layer. A separate conductor is caused to contact with the conductive pattern layer and the conductive pattern layer is caused to be electrically connected to an external electric circuit by the conductor.

12 Claims, 5 Drawing Sheets

CAPACITIVE INPUT SWITCH

TECHNICAL FIELD

The present invention relates to a capacitive input switch which is used for mobile equipment, household electrical appliances, in-vehicle center panels, steering switches, and the like represented by notebook-size personal computers, digital audio players and mobile phones.

BACKGROUND ART

Though not illustrated, in a conventional capacitive input switch accommodated in a housing of electronic equipment such as a notebook-size personal computer, a conductive pattern layer which is electrically connected to an external electric circuit is laminated on an insulating support layer, an insulating decorative layer which is positioned in the front face side of the housing is laminated on the conductive pattern layer, and the finger of a user appropriately contacts with the decorative layer.

In the conductive pattern layer, for example, a plurality of plane circular or rectangular pattern electrodes are formed by printing on the front face of an insulating film, and to each of the pattern electrodes, an elongated extraction line for electrically connecting to the external electric circuit is formed to be prolonged by printing.

In such a capacitive input switch, when the finger contacts with the decorative layer on the front face of the housing, a capacitor is formed between the pattern electrode of the conductive pattern layer and the finger and the place where the finger exists is detected as a change of an electrostatic capacitance (see Patent Literatures 1, 2 and 3).

RELATED ART LITERATURES

Patent Literatures

Patent Literature 1: Japanese Patent Publication Hei 07 No. 99346
Patent Literature 2: International Publication WO2003/036247
Patent Literature 3: Japanese Patent Application Laid-open Hei 05 No. 26753

SUMMARY OF THE INVENTION

Problems to be Solved by the Invention

The conventional capacitive input switch is configured as described above, in which the elongated extraction line is simply formed to be prolonged in the pattern electrode, so that when being accommodated in the housing, there is a case where the extraction line which extends in an XY direction becomes an obstacle to accommodating and it is sometimes impossible to appropriately accommodate. In addition, in view of enhancement of design properties, the capacitive input switch is sometimes three dimensionally solid-formed, and in such a case, the conductive pattern layer is also three dimensionally formed, so that the elongated extraction line further extends at a portion of the conductive pattern layer that is bent abruptly from a lateral direction to a longitudinal direction, for example, a corner portion or the like, resulting that there is a risk that durability of the extraction line is lowered to cause conduction failure or disconnection.

The present invention has been made in view of the above and aims to provide an capacitive input switch capable of being accommodated appropriately in a housing of equipment or the like and effectively suppressing conduction failure associated with three dimensional formation.

Means to Solve the Problems

In order to solve the above problems, the present invention provides one that comprises a rigidity imparting layer having rigidity and a laminate sheet provided being layered on the rigidity imparting layer to be applied with strength and that has at least the laminate sheet, among the rigidity imparting layer and the laminate sheet, three dimensionally formed, characterised in that the laminate sheet includes a substrate sheet, a conductive pattern layer for capacitor formation and a decorative layer that is laminated at least on any one of the substrate sheet and the conductive pattern layer, a separate conductor is caused to contact with the conductive pattern layer, and the conductive pattern layer is caused to be electrically connected to an external electric circuit by the conductor.

Note that, it is possible that the rigidity imparting layer and the laminate sheet are three dimensionally formed to position the laminate sheet on a front face of the rigidity imparting layer, and in an inner side of a back face of the rigidity imparting layer, a circuit board is mounted as well as a guide for the conductor is formed, so that the conductor is fitted into the guide and an end portion thereof is caused to contact with an electrode of the circuit board.

Further, it is possible that the rigidity imparting layer and the laminate sheet are three dimensionally formed to position the laminate sheet on the front face of the rigidity imparting layer, the rigidity imparting layer and the laminate sheet are mounted on a base plate, and the circuit board positioned below the rigidity imparting layer is mounted on the base plate as well as a guide plate positioned in the rigidity imparting layer is fixed to the circuit board, so that the conductor is inserted in a positioning hole provided in the guide plate and an end portion thereof is caused to contact with the electrode of the circuit board.

Further, it is possible that the rigidity imparting layer and the laminate sheet are three dimensionally formed to position the laminate sheet on the back face of the rigidity imparting layer, the rigidity imparting layer and the laminate sheet are mounted on the base plate, and the circuit board positioned below the laminate sheet is mounted on the base plate as well as the guide plate positioned in the laminate sheet is fixed to the circuit board, so that the conductor is inserted in the guide plate and an end portion thereof is caused to contact with the electrode of the circuit board.

Further, it is possible that a light guide path for guiding light beam from a light source to the laminate sheet is formed at least on any of the rigidity imparting layer, the base plate and the guide plate to apply light transmission to the laminate sheet.

Further, it is possible that the laminate sheet further includes a protective layer that is laminated on the decorative layer and contacts with a conductive body from outside.

Further, it is possible that a contacting portion between the conductive pattern layer and the conductor in the laminate sheet is coated by an anti-oxidizing film.

Further, it is possible that the conductive pattern layer of the laminate sheet includes a plurality of pattern electrodes for capacitor formation, extraction lines formed in each of the pattern electrodes and extraction electrodes formed in end portions of the extraction lines, and any of the plurality of pattern electrodes and the extraction electrodes are caused to contact with the conductor.

Further, it is preferable that the conductor is a conductive elastomer alone or an elastic electric connector in which a plurality of conductive elastomers and insulating elastomers are arrayed alternately.

Here, the rigidity imparting layer and the laminate sheet in the scope of claims may be three dimensionally formed together or may be three dimensionally formed separately. For example, the laminate sheet may be three dimensionally formed after three dimensional forming of the rigidity imparting layer or the rigidity imparting layer may be three dimensionally formed after three dimensional forming of the laminate sheet. For three dimensional forming, a compressed-air molding method, a vacuum forming method, a compression molding method, an injection-molding method or the like is employed.

The rigidity imparting layer may be a light guide for guiding light beam from a light source in a direction of the light transmittable laminate sheet. In addition, the substrate sheet, the conductive pattern layer, the decorative layer and the protective layer (including a surface protective layer) of the laminate sheet may have the same size or may have different sizes. The conductive pattern layer of the laminate sheet may be single or multiple similarly to the conductor, and is laminated on the front face and the back face of the substrate sheet and the decorative layer. Moreover, the decorative layer is appropriately laminated on the substrate sheet and the conductive pattern layer or the substrate sheet and the conductive pattern layer.

As the conductor, an anisotropic conductive electric connector capable of being electrically connected in press-contact is preferably used, but an elastic rubber, an elastic elastomer, a spring, a probe pin, a wire or the like having conductivity is also able to be used. Further, the conductive body may be used for connection as a heat seal connector or may be used with a metal body, a flexible board, a conductive unwoven fabric and a complex thereof, and a conductive spring being connected or in press-contact with each other by a conductive adhesive agent.

According to the present invention, when the conductive pattern layer of the laminate sheet is electrically connected to the external electric circuit, the conductor is used instead of a conventional elongated extraction line to be used for extending to the external electric circuit, so that when the capacitive input switch that is accommodated in a housing of electronic equipment, the extraction line is less likely to occupy a space to be an obstacle to accommodating. Accordingly, it is possible to appropriately accommodate the capacitive input switch in the housing of the electronic equipment. In addition, it is possible to omit or reduce the extraction line as necessary, thus making it possible to prevent such a situation that the finger is erroneously detected in the extraction line.

Effect of the Invention

According to the present invention, there is an effect that a capacitive input switch is able to be accommodated appropriately in a housing of equipment or the like and conduction failure associated with three dimensional formation is able to be effectively suppressed. In particular, when the capacitive input switch is three dimensionally formed, it is possible to prevent conduction failure in a corner portion or the like.

Further, the rigidity imparting layer and the laminate sheet are three dimensionally formed to position the laminate sheet on a front face of the rigidity imparting layer, and in an inner side of a back face of the rigidity imparting layer, a circuit board is mounted as well as a guide for the conductor is formed, so that the conductor is fitted into the guide and an end portion thereof is caused to contact with an electrode of the circuit board, thereby the conductor is compressed and deformed, thus making it possible to stabilize connection between the conductive pattern layer and the circuit board in the laminate sheet.

Further, the rigidity imparting layer and the laminate sheet are three dimensionally formed to position the laminate sheet on the front face of the rigidity imparting layer, the rigidity imparting layer and the laminate sheet are mounted on a base plate, and the circuit board positioned below the rigidity imparting layer is mounted on the base plate as well as a guide plate positioned in the rigidity imparting layer is fixed to the circuit board, so that the conductor is inserted in a positioning hole provided in the guide plate and an end portion thereof is caused to contact with the electrode of the circuit board, thereby it is not necessary to form a plurality of bosses in the rigidity imparting layer, thus making it possible to suppress molding failure associated with sink mark.

Further, since the conductor is inserted in the positioning hole of the guide plate, it is possible to position the conductor with high accuracy to contact with the electrode of the circuit board appropriately and it is also possible to expect deformation of the conductor with excellent posture.

Further, the rigidity imparting layer and the laminate sheet which are light transmitting are three dimensionally formed to position the laminate sheet on the back face of the rigidity imparting layer, the rigidity imparting layer and the laminate sheet are mounted on the base plate, and the circuit board positioned below the laminate sheet is mounted on the base plate as well as the guide plate positioned in the laminate sheet is fixed to the circuit board, so that the conductor is inserted in the guide plate and an end portion thereof is caused to contact with the electrode of the circuit board, thereby it is not necessary to form a plurality of bosses and the like in the rigidity imparting layer, thus making it possible to suppress molding failure associated with sink mark.

Further, since the conductor is inserted in the positioning hole of the guide plate, it is possible to position the conductor to contact with the electrode of the circuit board appropriately and it is also possible to expect elastic deformation of the conductor with excellent posture. Further, since the rigidity imparting layer is positioned in a front face side of electronic equipment, it is possible to protect the laminate sheet effectively and also to secure conduction easily.

Further, when a light guide path for guiding light beam from alight source to the laminate sheet is formed at least on any of the rigidity imparting layer, the base plate and the guide plate to apply light transmission to the laminate sheet, illumination of the laminate sheet makes it possible to seek enhancement of functionality and operability concerning inputting work.

Further, when the laminate sheet further includes a protective layer that is laminated on the decorative layer and contacts with a conductive body from outside, it is possible to effectively protect the decorative layer from damages associated with contact with the conductive body.

Further, when a contacting portion between the conductive pattern layer and the conductor in the laminate sheet is coated by an anti-oxidizing film, it is possible to expect that corrosion and oxidizing of the conductive pattern layer are prevented.

Further, when the conductor is an elastic electric connector in which a plurality of conductive elastomers and insulating elastomers are arrayed alternately, it is possible to contact the plurality of conductive elastomers with the pattern electrode and the extraction electrode of the conductive pattern layer, thus making it possible to suppress conduction failure associated with deviation of the conductive pattern layer.

MODES FOR CARRYING OUT THE INVENTION

Figure 1:
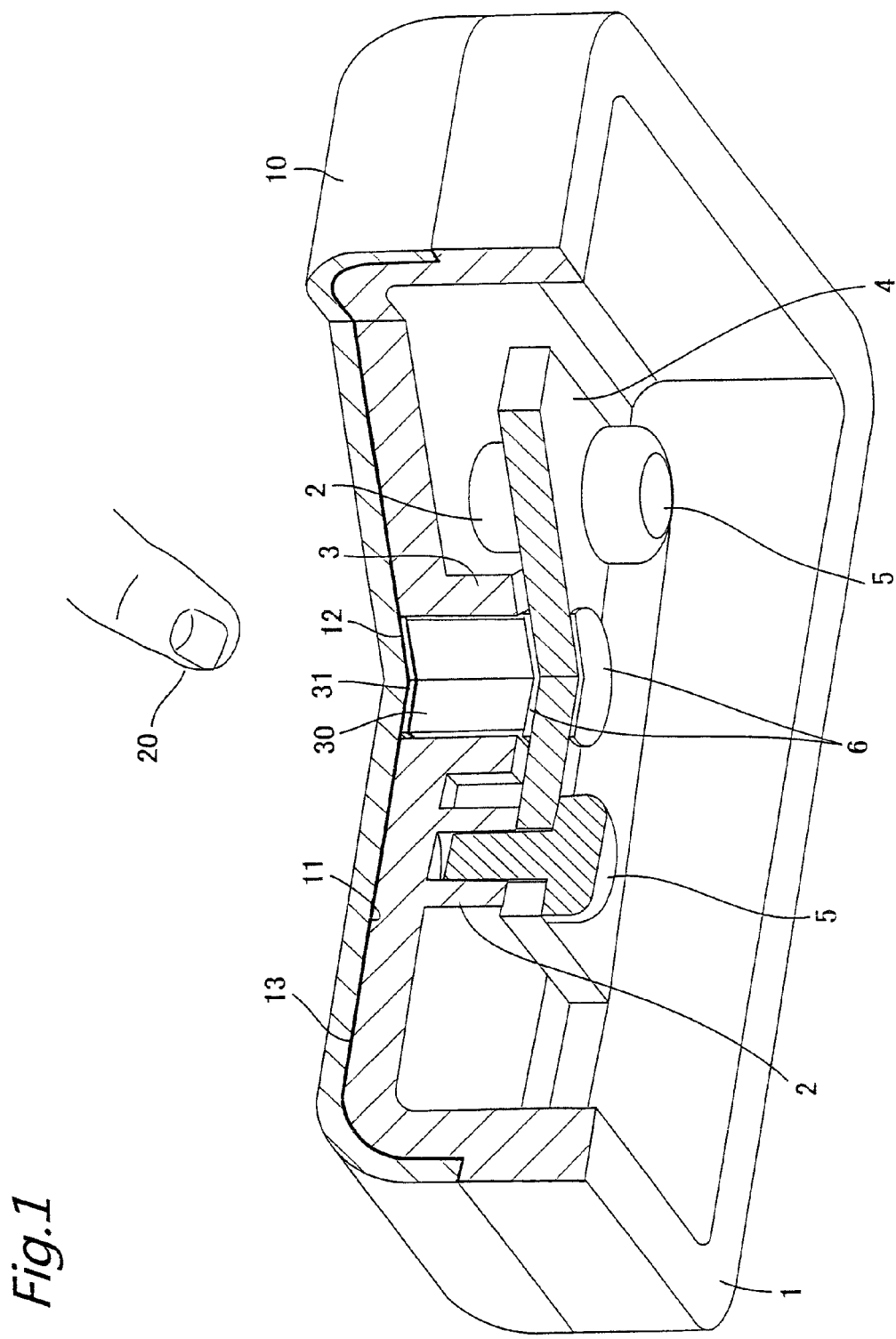
[FIG. 1] is a partially sectioned perspective view schematically showing an embodiment of a capacitive input switch according to the present invention from a back face side.

When description will hereinafter be given to preferred embodiments of a capacitive input switch according to the present invention with reference to drawings, as shown in FIG. 1, a capacitive input switch in this embodiment is a switch accommodated in a housing of electric equipment in which a laminate sheet 10 is laminated on a rigidity imparting layer 1 having rigidity, which are then three dimensionally solid-formed, and is electrically conducting by causing a separate conductor 30 which is excellent in durability to contact with or be proximate to a conductive pattern layer 12 which forms the laminate sheet 10 and is conductive and connecting the conductive pattern layer 12 through the conductor 30 to an external electric circuit.

The rigidity imparting layer 1 is formed to have a cross section approximately in an inverted dish shape, for example, using a predetermined material having rigidity, in which a plurality of mounting bosses 2 and mating guiding bosses 3 serving as a guide in a cylindrical shape for the conductor 30 are arrayed at predetermined intervals in a back face, and a circuit board 4 comprised of a printed wiring board is screw-fixed to the plurality of mounting bosses 2 through mounting screws 5. The predetermined material of the rigidity imparting layer 1 is not particularly limited, but, for example, hard polycarbonate, polybutylene terephthalate, modified polyphenylene ether, an ABS resin, an acrylic resin, polybutylene terephthalate or the like is able to be included.

Conductive lands 6 are pattern-formed on front and back faces of the circuit board 4, respectively, with a screen printing method, an etching method, a plating method or the like, and the plurality of lands 6 are rendered conductive with each other and electrically connected to an external electric circuit or an external circuit board represented by a signal processing circuit such as a CPU or an A/D converter through a lead wire.

The laminate sheet 10 is formed into a flexible multi-layer configuration including a substrate sheet 11, for example, comprised of a polyethylene terephthalate film or the like, the conductive pattern layer 12 which forms a capacitor, a decorative layer 13 which is laminated at least on either front or back face of the substrate sheet 11, and a surface protective layer which is laminated on the decorative layer 13 and positioned in the front face side of the housing when the decorative layer 13 is laminated on the front face of the substrate sheet 11, and keeps the shape with strength imparted by the rigidity imparting layer 1.

The conductive pattern layer 12 is formed to have a thin film by that, for example, a predetermined conductive material is subjected to screen printing or the like on a part of the back face of the substrate sheet 11 and coats the opened front face of the mating guiding boss 3. As the predetermined material of the conductive pattern layer 12, for example, metal (such as Al, copper or silver nanowire), silver paste, carbon or the like is able to be included.

When light transmissivity is required for the conductive pattern layer 12, ITO, silver nanowire, conductive polymer having light transmissivity (such as polypyrrole, polythiophene or polyaniline) is selectively used. The conductive pattern layer 12 is formed into a plane circular shape, an elliptical shape, a rectangular shape, a polygon shape or the like, but is formed in a divided manner in the plurality of pattern electrodes as necessary.

The decorative layer 13 is laminated, for example, on the front face of the substrate sheet 11, and is decoratively formed with patterns such as characters, graphics, codes, a combination thereof or a combination of them and color faintly laminated. The method for laminating the decorative layer 13 is not particularly limited, but, for example, a screen printing method by ink, a gravure printing method, an inkjet printing method, a pad printing method, a thermal transfer method or the like is employed.

The conductor 30 is formed into a columnar conductive rubber which is able to be elastically deformed by a conductive elastomer, for example, and is inserted into the mating guiding boss 3 of the rigidity imparting layer 1 as well as interposed being compressed between the land 6 of the circuit board 4 and the conductive pattern layer 12 so as to function as a conventional elongated extraction line of the conductive pattern layer 12.

An anti-oxidizing film 31 is selectively coated on a flat upper end face of the conductor 30 in press-contact with the conductive pattern layer 12, and the anti-oxidizing film 31 suppresses and prevents oxidizing, corrosion and the like of the conductive pattern layer 12. The anti-oxidizing film 31 is formed, for example, by a conductive material comprised of carbon or the like and an insulating resin material or is integrally formed by the similar material to that of the rigidity imparting layer 1 at the time of forming the rigidity imparting layer 1. The anti-oxidizing film 31 is preferably in press-contact with a flat portion without stress of the conductive pattern layer 12, in other words, an unstretched portion which is not stretched in a Z direction at the time of three dimensionally forming the conductive pattern layer 12.

The conductor 30 with such a configuration is positioned in the rigidity imparting layer 1 and directly contacts with the conductive pattern layer 12 positioned in the back face side of the laminate sheet 10 from downward to function so as to omit the extraction line.

Note that, connecting positions of the lands 6 of the circuit board 4, the conductive pattern layer 12 and the conductor 30, in particular, the connecting position of the conductor 30 are not particularly limited, but are preferably positions where a finger 20 hardly touches in terms of preventing erroneous operation.

In the above configuration, when the finger 20 of a user contacts with the surface protective layer on the front face of the housing, a capacitor is formed between the conductive pattern layer 12 and the finger 20 to change an electrostatic capacitance, so that the position where the finger 20 exists is detected as a change of the electrostatic capacitance.

According to the above configuration, since the conductor 30 comprised of a conductive rubber is used instead of the conventional extraction line and used for extending to the external electric circuit, so that when a capacitive input switch is accommodated in a housing of electronic equipment, an extraction line never occupies a space to be an obstacle to accommodating. Accordingly, it is possible to appropriately accommodate the capacitive input switch in the housing. In addition, omitting of the extraction line makes it possible to prevent erroneous detection that the finger 20 is erroneously detected by the extraction line.

In addition, the rigidity imparting layer 1 is integrated with the laminate sheet 10 and, from the periphery thereof, the extraction line does not extend in the XY direction, thus making it possible to accommodate and easily mount the capacitive input switch in the housing. Moreover, the conductor 30 is used, avoiding a portion that is bent abruptly from a lateral direction to a longitudinal direction or the like, to be used for extending to the external electric circuit, so that even if the capacitive input switch is three dimensionally solid-formed, there is never a risk of causing conduction failure in the corner portion or disconnection.

Further, the conductor 30 is not simply caused to contact with the flat portion of the conductive pattern layer 12 but the conductor 30 is caused to contact therewith in a state of being compressed and deformed, so that a space or the like is not generated between the conductive pattern layer 12 and the conductor 30 and stabilization of connection is able to be greatly expected.

Figure 2:
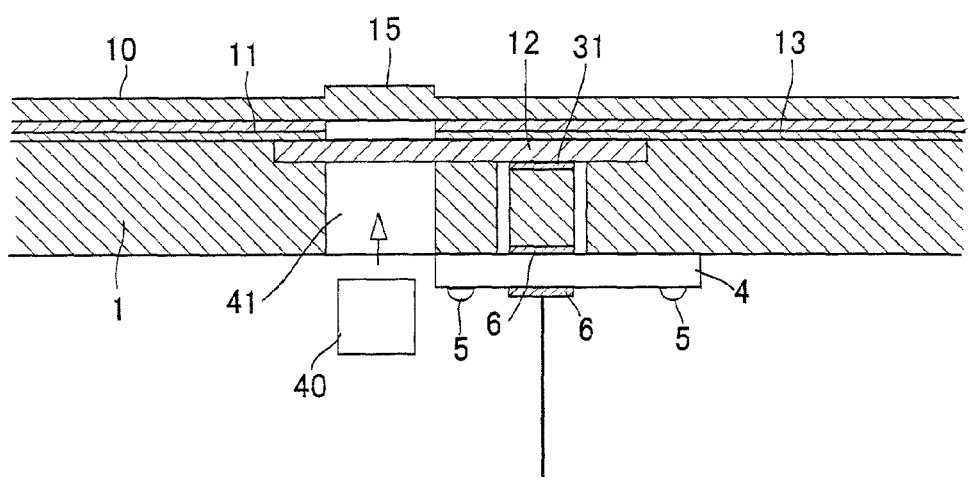
[FIG. 2] is a sectional explanatory view schematically showing a second embodiment of the capacitive input switch according to the present invention.

Next, FIG. 2 shows a second embodiment of the present invention, and in this case, a light guide path 41 which guides light beam from an LED 40 to the direction of the laminate sheet 10 is perforated in a thickness direction of the rigidity imparting layer 1 so that light transmissivity is applied at least to the laminate sheet 10 on the light guide path 41.

On the front face of the surface protective layer, a protruded portion 15 for causing a user to recognize to be an operation portion is integrally formed. Since other parts are approximately same as those in the above embodiment, description of which will be omitted.

The same operation and effect as that of the above embodiment is also able to be expected in this embodiment, and in addition, it is possible to illuminate the patterns comprised of characters, graphics, codes or the like of the decorative layer 13 forming the laminate sheet 10 with light beam of the LED 40, so that enhancement of functionality and operability is apparently able to be expected.

Figure 3:
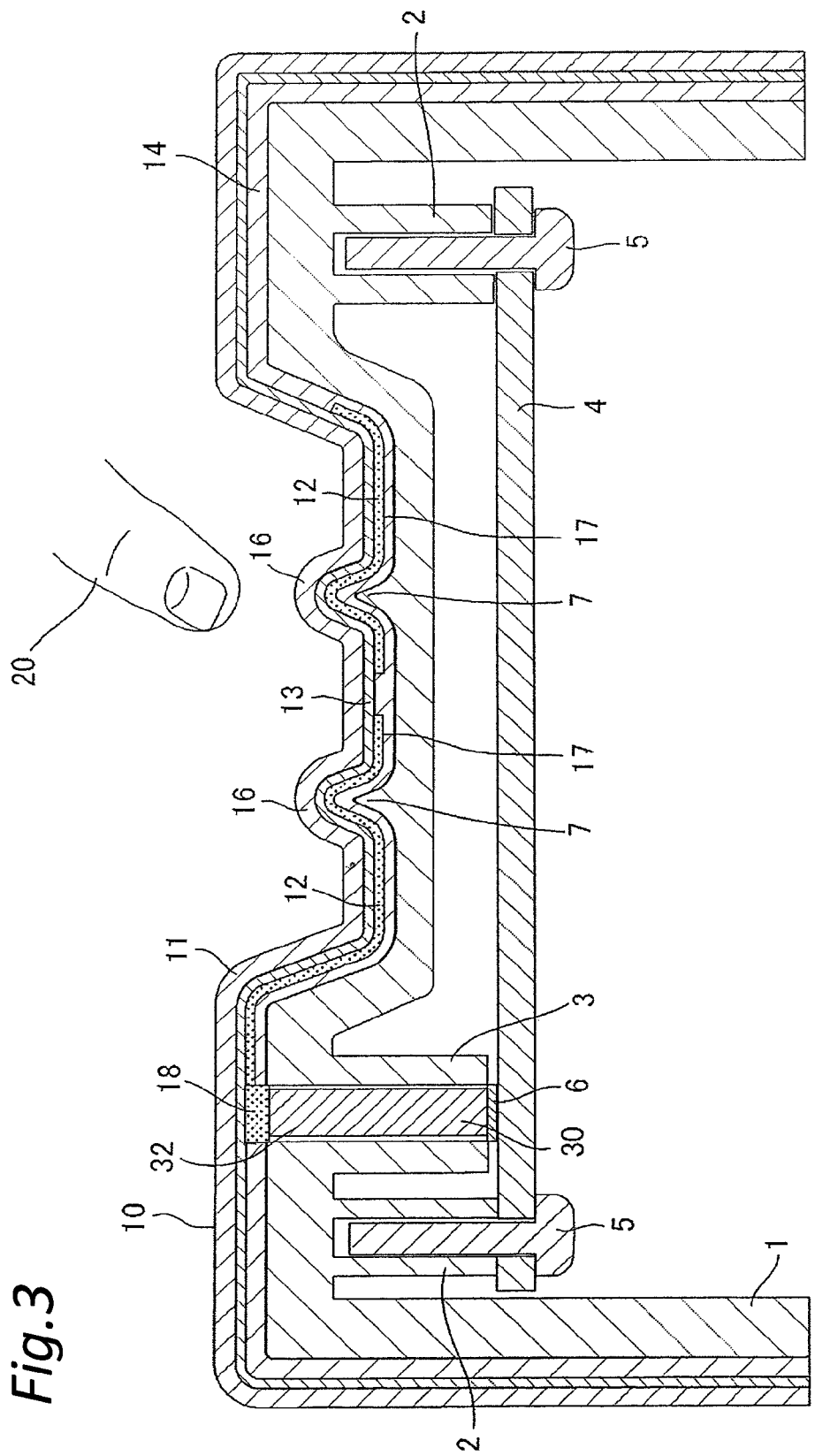
[FIG. 3] is a sectional explanatory view schematically showing a third embodiment of the capacitive input switch according to the present invention.

Next, FIG. 3 shows a third embodiment of the present invention, and in this case, the laminate sheet 10 is three dimensionally formed by thermoforming, on the back face of which, the rigidity imparting layer 1 is three dimensionally formed subsequently, and a plurality of extraction electrodes 18 are formed in the conductive pattern layer 12 of the laminate sheet 10, so that the anisotropic conductor 30 is in press-contact with the plurality of extraction electrodes 18.

The rigidity imparting layer 1 is subjected to injection-molding on the back face of the laminate sheet 10 which is three dimensionally formed and then three dimensionally formed to have an approximately M-shaped section with a center part surrounded being flatly recessed, and on the front face of the center part, a plurality of protruding portions 7 having an approximately V-shaped section are arrayed at intervals. On the back face of the rigidity imparting layer 1, the mating guiding boss 3 for the conductor 30 positioned near a periphery of the center part is formed in a rectangular prism shape.

The laminate sheet 10 is formed into a flexible multi-layer configuration including the substrate sheet 11 which is positioned in the front face side of the housing, the decorative layer 13 which is printed and laminated on the substrate sheet 11, the conductive pattern layer 12 which is printed and laminated on a part of the decorative layer 13 and a protective layer 14 which is laminated on the conductive pattern layer 12 and the decorative layer 13 to cover the front face of the rigidity imparting layer 1, and is three dimensionally formed by compressed air molding so that with the substrate sheet 11 on the back face thereof, the rigidity imparting layer 1 is then integrally formed.

The laminate sheet 10 is three dimensionally formed to have an approximately M-shaped section with a center part surrounded being flatly recessed, and is trimmed away by a press. In the laminate sheet 10, a plurality of protruding portions 16 are arrayed at intervals on the center part at the time of three dimensional forming and each of the protruding portions 16 is formed to have an approximately V-shaped section or an approximately semicircular shaped section and is mated with the projection portion 7 of the rigidity imparting layer 1.

In the conductive pattern layer 12, for example, a plurality of pattern electrodes 17 with an approximately sector-shaped plane which are positioned on the center part of the laminate sheet 10 and forms a capacitor are arrayed, and in a peripheral portion of each of the pattern electrodes 17, an elongated extraction line is formed short toward the direction of the mating guiding boss 3, and the extraction electrode 18 which contacts with the upper end face of the conductor 30 is integrally formed with a tip end portion of the extraction line.

The protective layer 14 is formed, for example, by polycarbonate-based ink, and when the rigidity imparting layer 1 is integrally formed on the laminate sheet 10 or the back face of the laminate sheet 10 formed three dimensionally, prevents the conductive pattern layer 12 and the decorative layer 13 which are positioned in the back face side of the laminate sheet 10 from being damaged. For the protective layer 14, a resin having excellent compatibility with a resin used for injection-molding of the rigidity imparting layer 1 is preferably used, and more preferably, use of the same type of resin is optimal.

Such a laminate sheet 10 is manufactured such that the decorative layer 13 is formed on the prepared substrate sheet 11 by screen printing with polycarbonate-based color ink, the conductive pattern layer 12 is formed on the decorative layer 13 by screen printing with silver paste and the like, and thereafter the protective layer 14 is printed and formed on the decorative layer 13 and the conductive pattern layer 12. At this time, the extraction electrode 18 of the conductive pattern layer 12 is formed to be coated with carbon ink in terms of anti-oxidizing.

The conductor 30 is comprised of an anisotropic conductive electric connector 32 in an approximately block shape or an approximately pillar shape in which, for example, a plurality of conductive elastomers and insulating elastomers are arrayed alternately, and is inserted into the mating guiding boss 3 to elastically contact with the lands 6 of the circuit board 4 and the plurality of extraction electrodes 18 electrically. The conductive elastomer is arrayed so that multiple pieces thereof contact with the each of the extraction electrodes 18 in terms of seeking reliable conduction. Since other parts are same as those in the above embodiments, description of which will be omitted.

The same operation and effect as that of the above embodiments is also able to be expected in this embodiment, and in addition, the conductor 30 comprised of an anisotropic conductive electric connector 32 is in press-contact with the plurality of extraction electrodes 18, and even when there is relative deviation in the plurality of extraction electrodes 18 and the electric connector 32, deviation error is effectively absorbed and conduction is secured, so that reliable conduction is apparently able to be expected regardless of slight deviation.

Figure 4:
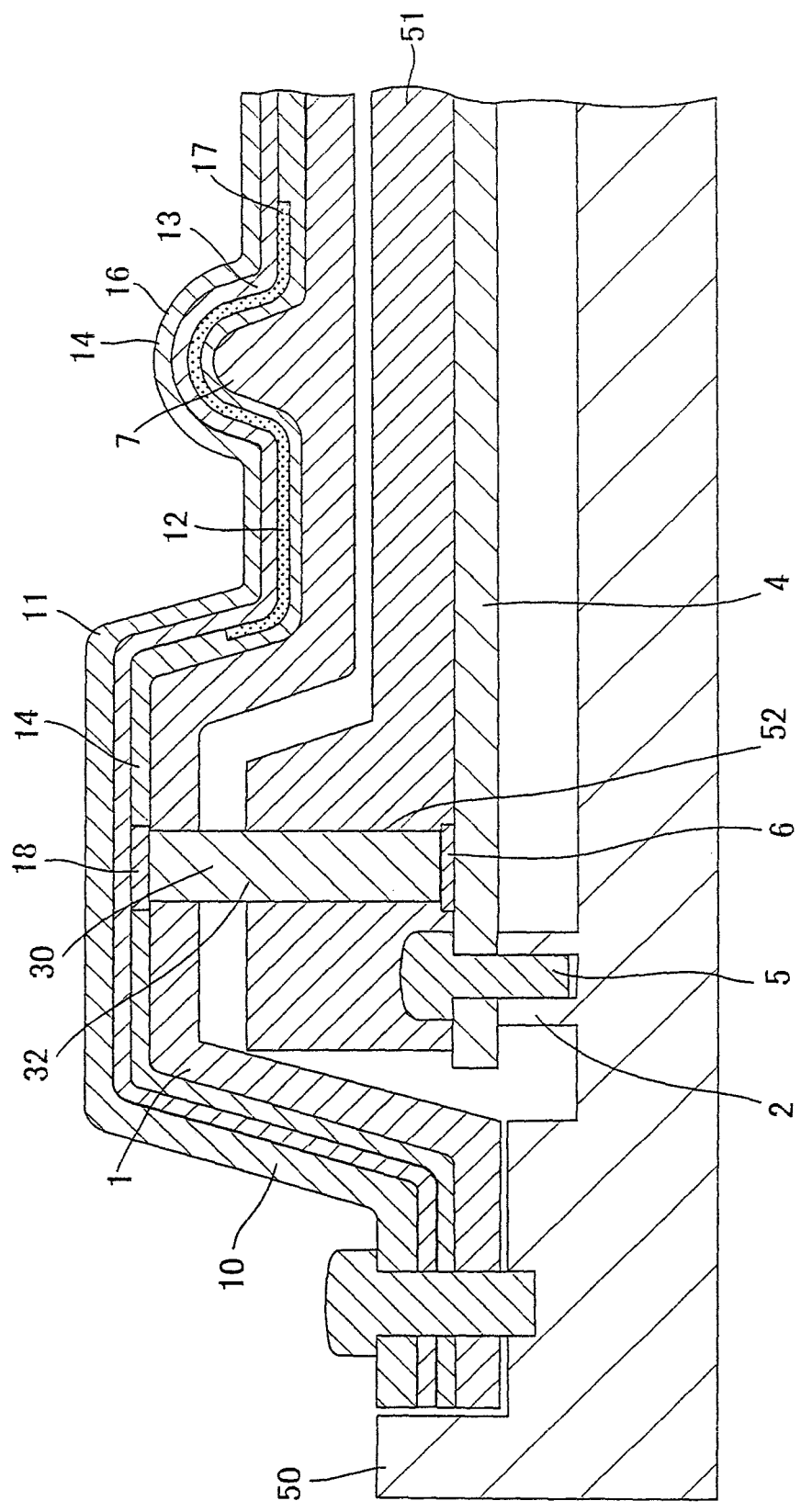
[FIG. 4] is a partially sectioned explanatory view schematically showing a fourth embodiment of the capacitive input switch according to the present invention.

Next, FIG. 4 shows a fourth embodiment of the present invention, and in this case, the rigidity imparting layer 1 and the laminate sheet 10 which are three dimensionally formed are mated and screwed with a base plate 50, and the circuit board 4 which is positioned below the rigidity imparting layer 1 is screwed with the base plate 50 as well as a separate guide plate 51 which is positioned in the rigidity imparting layer 1 through a space is laminated on and screwed with the front face of the circuit board 4, so that the anisotropic conductor 30 is inserted in the guide plate 51 to secure conduction.

The rigidity imparting layer 1 is subjected to insert-molding with predetermined thickness on the back face of the laminate sheet 10 which is three dimensionally formed in advance, and is integrated with the laminate sheet 10. In addition, the base plate 50 and the guide plate 51 are formed with, for example, molding materials containing predetermined resins, respectively, to which light transmitting property is applied as necessary. On the front face of the base plate 50, the plurality of mounting bosses 2 are formed, and the circuit board 4 and the guide plate 51 are screwed being layered through the screw 5 with each of the mounting bosses 2.

A positioning hole 52 is perforated in a thickness direction near a peripheral portion of the guide plate 51 and the conductor 30 is inserted in the positioning hole 52 so that a lower end portion thereof is in press-contact with the opposed land 6 of the circuit board 4. Since other parts are same as those in the above embodiments, description of which will be omitted.

The same operation and effect as that of the above embodiments is also able to be expected in this embodiment, and in addition, it is never necessary to form the plurality of mounting bosses 2 and mating guiding bosses 3 in the rigidity imparting layer 1, thus making it possible to suppress and prevent molding failure associated with sink mark. In addition, since the conductor 30 is inserted in the positioning hole 52 of the guide plate 51, it is possible to position the conductor 30 with high accuracy to contact with the land 6 of the circuit board 4 appropriately, and elastic deformation of the conductor 30 with excellent posture is also able to be greatly expected.

Figure 5:
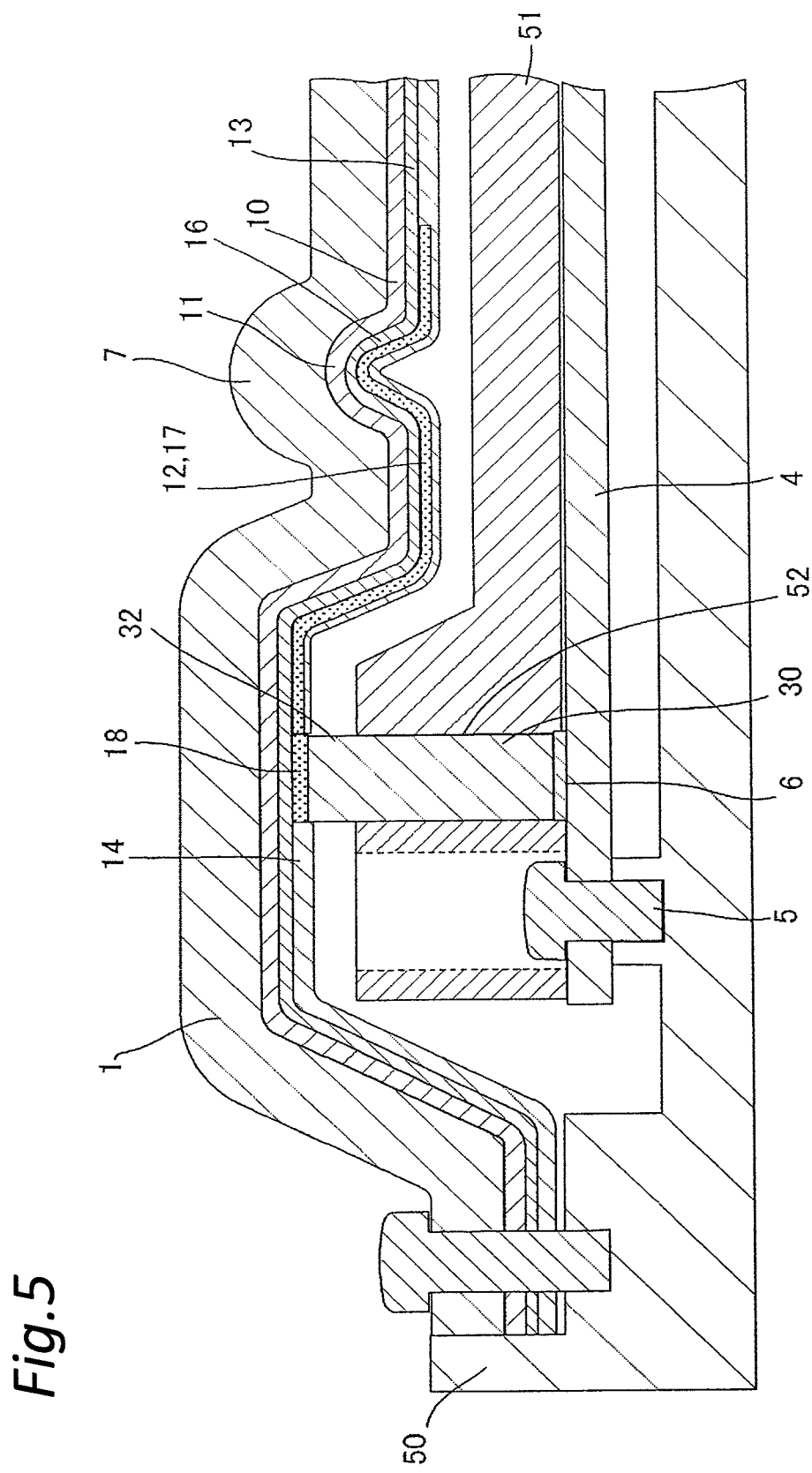
[FIG. 5] is a partially sectioned explanatory view schematically showing a fifth embodiment of the capacitive input switch according to the present invention.

Next, FIG. 5 shows a fifth embodiment of the present invention, and in this case, the rigidity imparting layer 1 and the laminate sheet 10 which are light transmittable are three dimensionally formed to position the laminate sheet 10 on the back face of the rigidity imparting layer 1, the rigidity imparting layer 1 and the laminate sheet 10 are mated and screwed with the base plate 50, and the circuit board 4 which is positioned below the laminate sheet 10 is screwed with the base plate 50 as well as the separate guide plate 51 which is positioned in the laminate sheet 10 through a space is laminated on and screwed with the front face of the circuit board 4, so that the anisotropic conductor 30 is inserted in the guide plate 51 to secure conduction.

As to the rigidity imparting layer 1 and the laminate sheet 10, for example, after three dimensional forming of the laminate sheet 10, the rigidity imparting layer 1 is three dimensionally formed later, or after each of the rigidity imparting layer 1 and the laminate sheet 10 is three dimensionally formed individually, these 1 and 10 are laminated and adhered. In addition, the conductive pattern layer 12 of the laminate sheet 10 is comprised of, for example, the plurality of pattern electrodes 17, and one pattern electrode 17 serves as one extraction electrode 18, with which the conductor 30 is directly in press-contact from downward. Since other parts are same as those in the above embodiments, description of which will be omitted.

The same operation and effect as that of the above embodiments is also able to be expected in this embodiment, and in addition, since the hard rigidity imparting layer 1 is positioned in the front face side, it is possible to effectively protect the flexible laminate sheet 10, to suppress and prevent sink mark associated with molding, and to secure conduction very easily. Further, since one pattern electrode 17 is directly in press-contact with the conductor 30, it is possible to seek to simplify the configuration with the extraction line omitted.

Note that, the rigidity imparting layer 1, the substrate sheet 11, the conductive pattern layer 12, the decorative layer 13 and the protective layer 14 in the above embodiments may be laminated by bonding with a sticky agent, an ultraviolet curable adhesive agent, a double-sided tape or the like. Moreover, the rigidity imparting layer 1 may serve as a light guide layer which guides light beam from the LED 40 in the direction of the substrate sheet 11, the conductive pattern layer 12, the decorative layer 13 and the protective layer 14 which are light transmittable. In addition, though the lands 6 are pattern-formed on the front and back faces of the circuit board 4, the front and back faces of the circuit board 4 may be connected through a through-hole. Further, a recessed portion for causing to recognize to be an operation portion is able to be formed on the front face of the protective layer 14.

In addition, it is also possible that a through hole is perforated in the circuit board 4 and the conductor 30 is inserted in the through hole to expose a tail end portion thereof for connection to an external electric circuit such as a CPU. Moreover, it is also possible to interpose a plurality of conductors 30 being compressed between the lands 6 of the circuit board 4 and the plurality of conductive pattern layers 12.

Further, the conductor 30 is not particularly limited as far as causing the conductive pattern layer 12 to be conductive with the circuit board 4, and may be also one in which, for example, conductive materials processed into a column in a circular cylinder shape, a circular truncated cone shape or a polygonal shape are embedded in insulating materials. Further, the guide plate 51 may have the approximately same size as that of the circuit board 4, but may be longer or shorter as necessary.

EXPLANATIONS OF NUMERALS 1 rigidity imparting layer
2 mounting boss
3 mating guiding boss (guide)
4 circuit board
5 screw
6 land (electrode)
10 laminate sheet
11 substrate sheet
12 conductive pattern layer
13 decorative layer
14 protective layer
17 pattern electrode
18 extraction electrode
20 finger (conductive body)
30 conductor
31 anti-oxidizing film
32 electric connector
40 LED (light source)
41 light guide path
50 base plate 51 guide plate
52 positioning hole

What is claimed is:

1. A capacitive input switch that comprises a rigidity imparting layer having rigidity and a laminate sheet provided being layered on the rigidity imparting layer to be applied with strength and that has at least the laminate sheet, among the rigidity imparting layer and the laminate sheet, three dimensionally formed, wherein the laminate sheet includes a substrate sheet, a conductive pattern layer for capacitor formation and a decorative layer that is laminated at least on any one of the substrate sheet and the conductive pattern layer, a separate conductor is caused to contact with the conductive pattern layer, and the conductive pattern layer is caused to be electrically connected to an external electric circuit by the conductor, and wherein the rigidity imparting layer and the laminate sheet are three dimensionally formed to position the laminate sheet on the front face of the rigidity imparting layer, and the rigidity imparting layer and the laminate sheet are mounted on a base plate, and the circuit board positioned below the rigidity imparting layer is mounted on the base plate as well as a guide plate positioned in the rigidity imparting layer is fixed to the circuit board, so that the conductor is inserted in a positioning hole provided in the guide plate and an end portion thereof is caused to contact with the electrode of the circuit board.

2. The capacitive input switch according to claim 1, wherein the laminate sheet further includes a protective layer that is laminated on the decorative layer and contacts with a conductive body from outside.

3. The capacitive input switch according to claim 1, wherein a contacting portion between the conductive pattern layer and the conductor in the laminate sheet is coated by an anti-oxidizing film.

4. The capacitive input switch according to claim 1, wherein the conductive pattern layer of the laminate sheet includes a plurality of pattern electrodes for capacitor formation, extraction lines formed in each of the pattern electrodes and extraction electrodes formed in end portions of the extraction lines, and any of the plurality of pattern electrodes and the extraction electrodes are caused to contact with the conductor.

5. The capacitive input switch according to claim 1, wherein the conductor is a conductive elastomer alone or an elastic electric connector in which a plurality of conductive elastomers and insulating elastomers are arrayed alternately.

6. The capacitive input switch that comprises a rigidity imparting layer having rigidity and a laminate sheet provided being layered on the rigidity imparting layer to be applied with strength and that has at least the laminate sheet, among the rigidity imparting layer and the laminate sheet, three dimensionally formed, wherein the laminate sheet includes a substrate sheet, a conductive pattern layer for capacitor formation and a decorative layer that is laminated at least on any one of the substrate sheet and the conductive pattern layer, a separate conductor is caused to contact with the conductive pattern layer, and the conductive pattern layer is caused to be electrically connected to an external electric circuit by the conductor, and wherein the rigidity imparting layer and the laminate sheet are three dimensionally formed to position the laminate sheet on the back face of the rigidity imparting layer, the rigidity imparting layer and the laminate sheet are mounted on a base plate, and the circuit board positioned below the laminate sheet is mounted on the base plate as well as a guide plate positioned in the laminate sheet is fixed to the circuit board, so that the conductor is inserted in the guide plate and an end portion thereof is caused to contact with the electrode of the circuit board.

7. The capacitive input switch according to claim 6, wherein a light guide path for guiding light beam from a light source to the laminate sheet is formed at least on any of the rigidity imparting layer, the base plate and the guide plate to apply light transmission to the laminate sheet.

8. The capacitive input switch according to claim 6, wherein the laminate sheet further includes a protective layer that is laminated on the decorative layer and contacts with a conductive body from outside.

9. The capacitive input switch according to claim 6, wherein a contacting portion between the conductive pattern layer and the conductor in the laminate sheet is coated by an anti-oxidizing film.

10. The capacitive input switch according to claim 6, wherein the conductive pattern layer of the laminate sheet includes a plurality of pattern electrodes for capacitor formation, extraction lines formed in each of the pattern electrodes and extraction electrodes formed in end portions of the extraction lines, and any of the plurality of pattern electrodes and the extraction electrodes are caused to contact with the conductor.

11. The capacitive input switch according to claim 6, wherein the conductor is a conductive elastomer alone or an elastic electric connector in which a plurality of conductive elastomers and insulating elastomers are arrayed alternately.

12. The capacitive input switch that comprises a rigidity imparting layer having rigidity and a laminate sheet provided being layered on the rigidity imparting layer to be applied with strength and that has at least the laminate sheet, among the rigidity imparting layer and the laminate sheet, three dimensionally formed, wherein the laminate sheet includes a substrate sheet, a conductive pattern layer for capacitor formation and a decorative layer that is laminated at least on any one of the substrate sheet and the conductive pattern layer, a separate conductor is caused to contact with the conductive pattern layer, and the conductive pattern layer is caused to be electrically connected to an external electric circuit by the conductor, and wherein a light guide path for guiding light beam from a light source to the laminate sheet is formed at least on any of the rigidity imparting layer, the base plate and the guide plate to apply light transmission to the laminate sheet.

* * * * *